(12) United States Patent
Wang

(10) Patent No.: US 9,854,033 B2
(45) Date of Patent: *Dec. 26, 2017

(54) SYSTEM FOR CONTENT CONTINUATION AND HANDOFF

(71) Applicant: Frank C. Wang, Boca Raton, FL (US)

(72) Inventor: Frank C. Wang, Boca Raton, FL (US)

( * ) Notice: Subject to any disclaimer, the term of this patent is extended or adjusted under 35 U.S.C. 154(b) by 28 days.

This patent is subject to a terminal disclaimer.

(21) Appl. No.: 15/162,498

(22) Filed: May 23, 2016

(65) Prior Publication Data

US 2016/0269476 A1     Sep. 15, 2016

Related U.S. Application Data

(63) Continuation of application No. 14/598,825, filed on Jan. 16, 2015, now Pat. No. 9,350,799, which is a
(Continued)

(51) Int. Cl.
*G06F 15/167* (2006.01)
*H04L 29/08* (2006.01)
(Continued)

(52) U.S. Cl.
CPC ........ *H04L 67/10* (2013.01); *G06F 17/30091* (2013.01); *H01L 29/7869* (2013.01);
(Continued)

(58) Field of Classification Search
USPC .......................................................... 709/217
See application file for complete search history.

(56) References Cited

U.S. PATENT DOCUMENTS

| 4,937,702 A | 6/1990 | Kurihara | 340/567 |
| 5,867,099 A | 2/1999 | Keeter | 361/179 |

(Continued)

FOREIGN PATENT DOCUMENTS

JP     2014/529234 A1     10/2014

OTHER PUBLICATIONS

U.S. Appl. No. 10/837,808, dated May 2004, Rudin.
U.S. Appl. No. 11/562,796, dated Nov. 2006, Farkas.

*Primary Examiner* — Razu A Miah
(74) *Attorney, Agent, or Firm* — Kenneth A. Seaman

(57) ABSTRACT

A content delivery system and method for use with plurality of digital multimedia data processing systems and legacy systems spanning across one or more network environments. The system and method enable users with freedom of mobility while maintaining access to the user's selected content while the user transitions from one device in one location to a different device in a difference location, substantially without interruption and without the need for user action to turn on and off these target data processing systems. The Instant Invention can provide high bandwidth content delivery solutions based upon hardware and software components by activating a target device while the system is proximate to the target device and, in one embodiment, automatically redirecting the content while the system is proximate to a new target device without user intervention. The target devices include digital multimedia data processing systems and legacy systems including, but not limited to, HDTVs, TV, Personal Computers, digital music systems, printers, radios, and fax machines.

33 Claims, 8 Drawing Sheets

Related U.S. Application Data continuation of application No. 12/573,106, filed on Oct. 3, 2009, now Pat. No. 8,938,497.

(51) Int. Cl.
  *G06F 17/30* (2006.01)
  *H01L 29/786* (2006.01)
  *H04L 29/06* (2006.01)
  *H04W 4/02* (2009.01)

(52) U.S. Cl.
  CPC ...... *H04L 65/4084* (2013.01); *H04L 67/1097* (2013.01); *H04L 67/148* (2013.01); *H04L 67/18* (2013.01); *H04L 67/38* (2013.01); *H04L 29/0809* (2013.01); *H04W 4/023* (2013.01)

(56) References Cited

U.S. PATENT DOCUMENTS

| | | | |
|---|---|---|---|
| 5,913,028 A | 6/1999 | Wang et al. | 709/203 |
| 5,956,626 A * | 9/1999 | Kaschke | G08B 3/1041 |
| | | | 340/552 |
| 5,963,134 A | 10/1999 | Bowers | 340/572.1 |
| 6,317,761 B1 | 11/2001 | Landsman | 707/513 |
| 6,742,028 B1 | 5/2004 | Wang et al. | 709/223 |
| 6,857,714 B2 | 2/2005 | Hohberger | 347/2 |
| 6,961,348 B2 | 11/2005 | Yu | 370/466 |
| 7,103,906 B1 | 9/2006 | Katz et al. | 725/86 |
| 7,398,009 B2 | 7/2008 | Candelore et al. | 386/248 |
| 7,944,896 B1 * | 5/2011 | Rawat | H04W 4/10 |
| | | | 370/338 |
| 7,984,179 B1 | 7/2011 | Huang | 709/233 |
| 7,986,917 B2 * | 7/2011 | Ahlgren | H04M 1/7253 |
| | | | 455/41.2 |
| 8,065,388 B1 | 11/2011 | Gautier | 701/532 |
| 8,255,825 B2 | 8/2012 | Morris | 715/781 |
| 8,285,199 B2 | 10/2012 | Hsu et al. | 455/3.06 |
| 8,972,048 B2 | 3/2015 | Canora et al. | 700/237 |
| 9,143,988 B2 * | 9/2015 | Diachina | H04W 36/0066 |
| 9,247,001 B2 | 1/2016 | Wang | 709/217 |
| 9,350,799 B2 | 5/2016 | Wang | 709/217 |
| 2002/0055972 A1 | 5/2002 | Weinman, Jr. | 709/203 |
| 2002/0073235 A1 | 6/2002 | Chen | 709/246 |
| 2003/0078978 A1 | 4/2003 | Lardin | 709/206 |
| 2003/0119527 A1 | 6/2003 | Labun | 455/456.1 |
| 2003/0204602 A1 | 10/2003 | Hudson | 709/228 |
| 2004/0198398 A1 | 10/2004 | Amir | 455/456.1 |
| 2005/0281436 A1 | 12/2005 | Gehring et al. | 382/104 |
| 2007/0021216 A1 | 1/2007 | Guruparan | 463/43 |
| 2007/0047523 A1 | 3/2007 | Jiang | 370/352 |
| 2007/0083910 A1 | 4/2007 | Haneef et al. | 725/235 |
| 2008/0037525 A1 | 2/2008 | Karaoguz et al. | 370/352 |
| 2008/0039203 A1 * | 2/2008 | Ackley | A63F 13/79 |
| | | | 463/40 |
| 2008/0039212 A1 * | 2/2008 | Ahlgren | H04M 1/7253 |
| | | | 463/46 |
| 2008/0092177 A1 | 4/2008 | Swanburg et al. | 725/62 |
| 2008/0120094 A1 | 5/2008 | Mate et al. | 704/201 |
| 2008/0133781 A1 | 6/2008 | Ashley et al. | 710/17 |
| 2008/0134245 A1 | 6/2008 | Dacosta Behram | 725/44 |
| 2008/0134256 A1 | 6/2008 | Dacosta Behram | 725/62 |
| 2008/0268770 A1 | 10/2008 | Ashbrook | 455/3.01 |
| 2008/0301580 A1 | 12/2008 | Hjelmeland Alams | 715/808 |
| 2009/0111453 A1 * | 4/2009 | Hsu | G06F 8/61 |
| | | | 455/419 |
| 2009/0125442 A1 * | 5/2009 | Otto | G06Q 20/04 |
| | | | 705/39 |
| 2009/0140986 A1 | 6/2009 | Karkkainen | 345/173 |
| 2009/0160694 A1 | 6/2009 | Di Flora | 341/176 |
| 2009/0176529 A1 * | 7/2009 | Warren | H04M 1/6091 |
| | | | 455/557 |
| 2009/0210913 A1 | 8/2009 | MacDonald et al. | 725/85 |
| 2009/0234983 A1 | 9/2009 | Golden | 710/30 |
| 2010/0031299 A1 | 2/2010 | Harrang et al. | 725/80 |
| 2010/0070613 A1 | 3/2010 | Chen et al. | 709/219 |
| 2010/0146567 A1 | 6/2010 | Mehta et al. | 725/91 |
| 2010/0169817 A1 | 7/2010 | Want et al. | 715/772 |
| 2010/0189064 A1 | 7/2010 | Raveendran | 370/329 |
| 2010/0191859 A1 | 7/2010 | Raveendran | 709/231 |
| 2010/0208029 A1 | 8/2010 | Marti et al. | 348/14.02 |
| 2010/0216402 A1 | 8/2010 | Appleby et al. | 455/41.3 |
| 2010/0235869 A1 | 9/2010 | Zhao et al. | 725/82 |
| 2010/0275135 A1 | 10/2010 | Dunton et al. | 715/753 |
| 2010/0278345 A1 | 11/2010 | Alsina et al. | 380/283 |
| 2010/0304737 A1 | 12/2010 | Jain et al. | 455/426.1 |
| 2010/0310125 A1 * | 12/2010 | Hsieh | G06T 7/73 |
| | | | 382/103 |
| 2010/0310227 A1 | 12/2010 | Baumgartner et al. | 386/200 |
| 2010/0315549 A1 | 12/2010 | Basso et al. | 348/445 |
| 2010/0332565 A1 * | 12/2010 | Al-Shaykh | G06F 17/30905 |
| | | | 707/912 |
| 2010/0333136 A1 | 12/2010 | Lau et al. | 725/39 |
| 2011/0010418 A1 | 1/2011 | Lipinski | 709/203 |
| 2011/0010422 A1 | 1/2011 | Bezancon et al. | 709/204 |
| 2011/0052158 A1 | 3/2011 | Baker et al. | 386/349 |
| 2011/0093892 A1 | 4/2011 | Arnold et al. | 725/38 |
| 2011/0131520 A1 | 6/2011 | Al-Shaykh | 715/772 |
| 2011/0273309 A1 * | 11/2011 | Zhang | H04M 1/72536 |
| | | | 340/870.07 |
| 2011/0320554 A1 | 12/2011 | Melander | 709/206 |

* cited by examiner

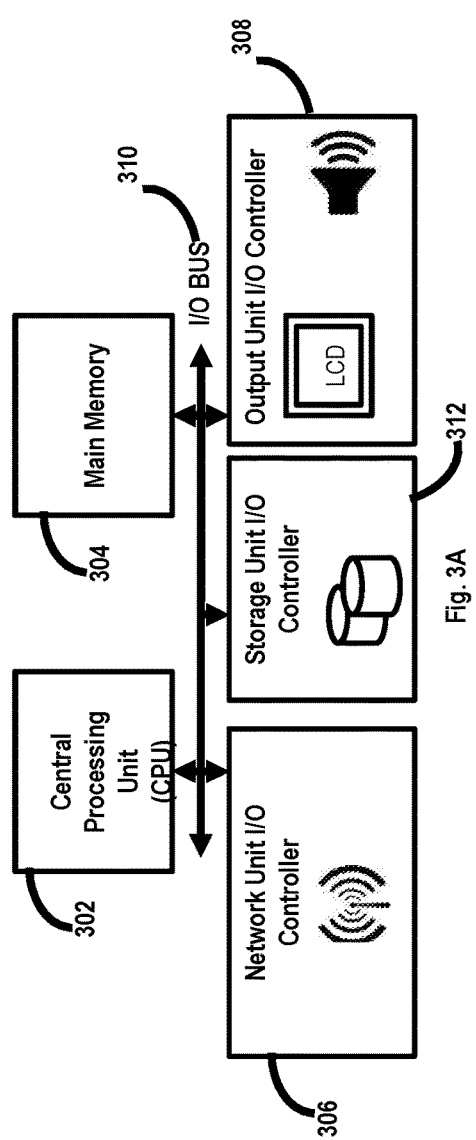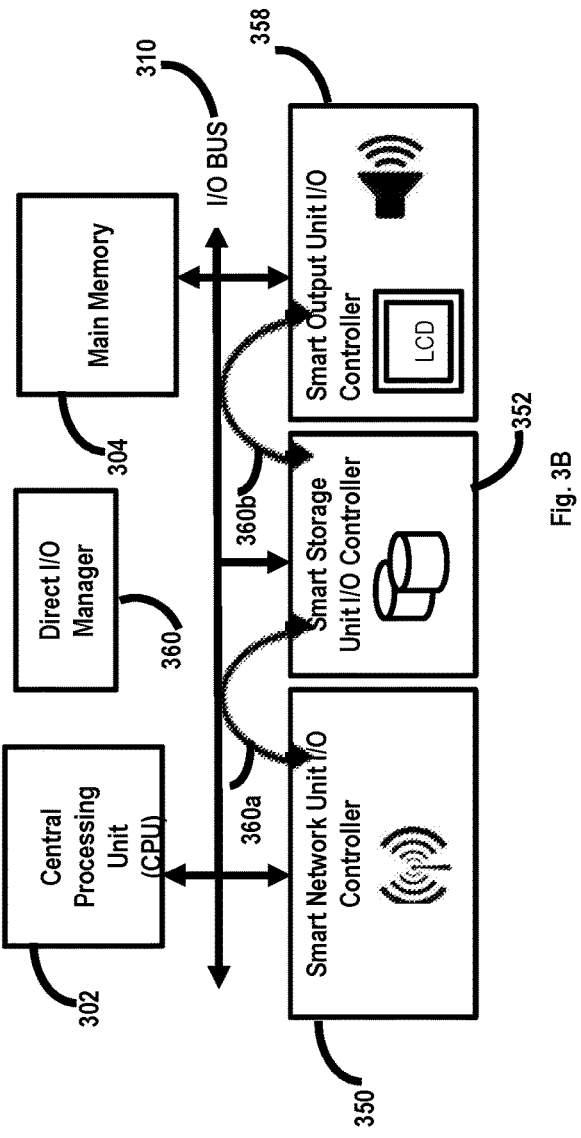

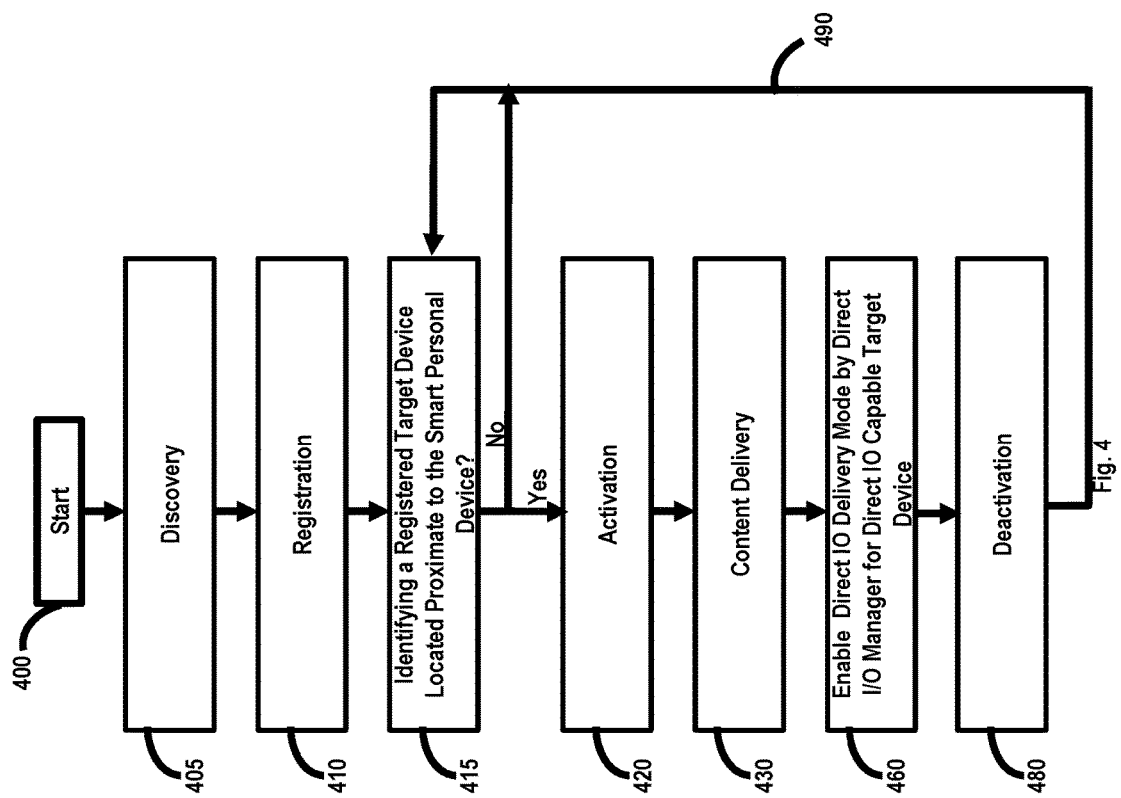

SYSTEM FOR CONTENT CONTINUATION AND HANDOFF

CROSS REFERENCE TO RELATED PATENTS

The present patent application is a co-pending continuation of U.S. patent application Ser. No. 14/598,825 filed Jan. 16, 2015 by the inventor Frank C. Wang and entitled "Enhanced Content Continuation System and Method" (a patent which is sometimes referred to as the "Enhanced Content Continuation Patent").

The Enhanced Content Continuation Patent is a continuation patent application of a previously-filed patent application entitled "Content Delivery System and Method Spanning Multiple Data Processing Systems" filed Oct. 3, 2009 as Ser. No. 12/573,106 by inventor Frank C. Wang. The patent application detailed in this paragraph issued as U.S. Pat. No. 8,938,497 on Jan. 20, 2015.

The present patent application is also related to the following patents:

A previously-filed patent application entitled "Content Delivery System and Method" filed Jan. 14, 2011 as Ser. No. 12/930,727 by inventor Frank C. Wang. This patent application detailed in this paragraph issued as U.S. Pat. No. 8,412,798 on Apr. 2, 2013.

A previously-filed patent application entitled "Content Delivery System and Method" filed Mar. 22, 2013 as Ser. No. 13/848,896 on by inventor Frank C. Wang. This patent application detailed in this paragraph issued as U.S. Pat. No. 9,247,001 on Jan. 6, 2016.

A previously-filed and currently pending patent application entitled "ENHANCED CONTENT DELIVERY SYSTEM AND METHOD SPANNING MULTIPLE DATA PROCESSING SYSTEMS" filed Oct. 31, 2014 as Ser. No. 14/529,234 by inventor Frank C. Wang.

A previously-filed and currently pending patent application entitled "Content Continuation System and Method" filed Jan. 22, 2016 as Ser. No. 15/004,838 by inventor Frank C. Wang.

The specifications and drawings from each of these previously-filed patents and patent applications are specifically incorporated herein by reference.

FIELD OF THE INVENTION

This invention relates generally to a content delivery system and method for enabling a user's freedom of mobility while maintaining access to "real-time" on-going content without substantial interruption to the content delivery and without requiring user intervention; even as the user transitions from one physical location where the content is accessed from multimedia data processing system (referred to as target device herein) on one network environment to the next physical location with different target device on a different network environment. More particularly, the present invention improves content delivery between a smart personal device and a plurality of target devices while reducing power consumption of the devices; and being able to pull desirable content from the target devices including but not limited to contents located on a single network location, on multiple network locations, and content hosts located over the internet.

DESCRIPTION OF THE BACKGROUND ART

Technology has brought us the personal computer (PC), HDTV, Digital personal Multimedia player, Personal Video Recorder, Smart Phone . . . however in our daily interaction with these analog and digital target devices we are still limited under the current model of being tied down to the physical location of each of these devices, i.e. the content is always accessed by user within proximate to the given device whereas the contents are either stored, displayed, or being sourced from the device. The physical distance limitation restricts a user to sit in front of a PC, sitting around a TV and PVR to watch a TV content, which severely limits our freedom of mobility especially when a user may have multiple TVs and multiple work environments in one location. The content is delivered to each physical device by plurality of ways is another limitation in that a HDTV devices can receive contents from Cable, antenna, satellite dish, USB, Ethernet LAN, Wireless LAN. Even when devices receive content via a similar source, each device would need to be interface and programmed individually. Another limitation is that contents are only accessible on each physical target device with its own unique user interface or being able to remote controlled. User has to learn the user interface and or control buttons of each device to operate from simple turning on and off to gaining access to the content of a selected device. Another drawback from the current content accessing model is wasted energy and bandwidth requirements. With multiple target devices around a home or office, we have to turn on a device when we desire to operate or access the contents upon entering its surrounding location. Frequently we have these devices turned on in multiple locations so a user can be mobile from one location to another, using transmission bandwidth for each unit even though a user is no longer proximate to the device. Another drawback from the current content accessing model is that the content to be access by the user are store either within these target devices or close by the physical device itself i.e. a home entertainment center including a TV, a DVR, a music system . . . etc. As a result, plurality of remote control devices might be implemented to provide users with access to content and operations with all devices located proximate of each other. We are well aware of the inconvenience of plurality of remote devices around a given location. The inefficiency in the current model produces undesirable side effects such as in the case of leaving the devices turned on, which include wasted electricity, running up the usage of the devices thus reducing the useful life and dealing with the heat generated by the devices. In addition, managing multiple user interfaces and remote controls for each of the devices is time-consuming and can be frustrating. Another undesirable side effect is the potential of interference of these devices on wireless networks amongst each other. One of the disadvantages from the user's perspective is the inherent deficiency in the physical range limitation of device centered sourcing and control, which prohibits the continuity of operations and content access and delivery when user physically moves from one location to another.

Accordingly, the prior art systems for delivering and accessing content from these target devices have significant disadvantages and limitations. It would, therefore, be highly desirable to employ a smart apparatus which can eliminate the problems of the conventional process and allows users to have freedom of mobility while accessing the desired contents spanning multiple target devices without interruption and without requiring user intervention.

SUMMARY OF THE INVENTION

A smart personal device is a digital Device which can discover, register, activate, deliver content and deactivate of a plurality of target devices including but not limited to HDTV, PVR, PMP, PC, DVR around a home, office, hotel room, conference center as described herein. The smart personal device can be embedded within a digital device including, but not limited to, a smart phone, a personal computer, a laptop, a netbook, a GPS, a personal multimedia player, video MP3 player, a portable radio or a tablet PC.

The smart personal device is used to first discover multiple target devices upon identifying one or more target device(s) located proximate to the smart personal device. The present invention uses RFID solution for discovering target devices around one or more physical locations, although it is not limited to a specific communication technology in the future (i.e. wireless USB, wi-fi, RF, FM, Cable, etc). Once a target device is discovered and registration steps are completed, the target device in one embodiment to be placed in a sleep mode if the target device is not being used by a user or there is no smart personal device is in proximate to the target device. Upon the smart personal device identifying one or more target device located proximate to the smart personal device and based on the desired state of the smart personal device, it will automatically wakeup and activate one or more of the target devices and deliver content to the target device to meet the need of the user. These include but not limited to receive and display contents from the Personal Smart Device as in the case of a HDTV, receive and play contents from the smart personal device in the case of a digital speaker system, receive and display contents of an application as in the case of a personal computer. When the smart personal device is no longer proximate to the target device, the target device will be deactivated by the Personal Smart Device and resume its sleep mode.

The present invention is a system and method which overcomes the limitations and disadvantages of the prior art by providing a simple and convenient way of allowing a user with freedom of mobility and to move from one environment to another while continually accessing his content without interruption.

BRIEF DESCRIPTION OF THE DRAWINGS

The aforementioned and other features and objects of the present invention and the manner of attaining them will become more apparent; and the invention itself will be best understood by reference to the following description of a preferred embodiment taken in conjunction with the accompanying drawings, wherein:

FIGS. 3A, and 3B are block diagram of the exemplary system embodiment of a smart personal device which is used in accordance with the present invention;

FIG. 4 is a flow diagram of the Instant invention illustrating a selected flow of interaction between a smart personal device and a target device;

DETAILED DESCRIPTIONS OF PREFERRED EMBODIMENTS

Figure 1:
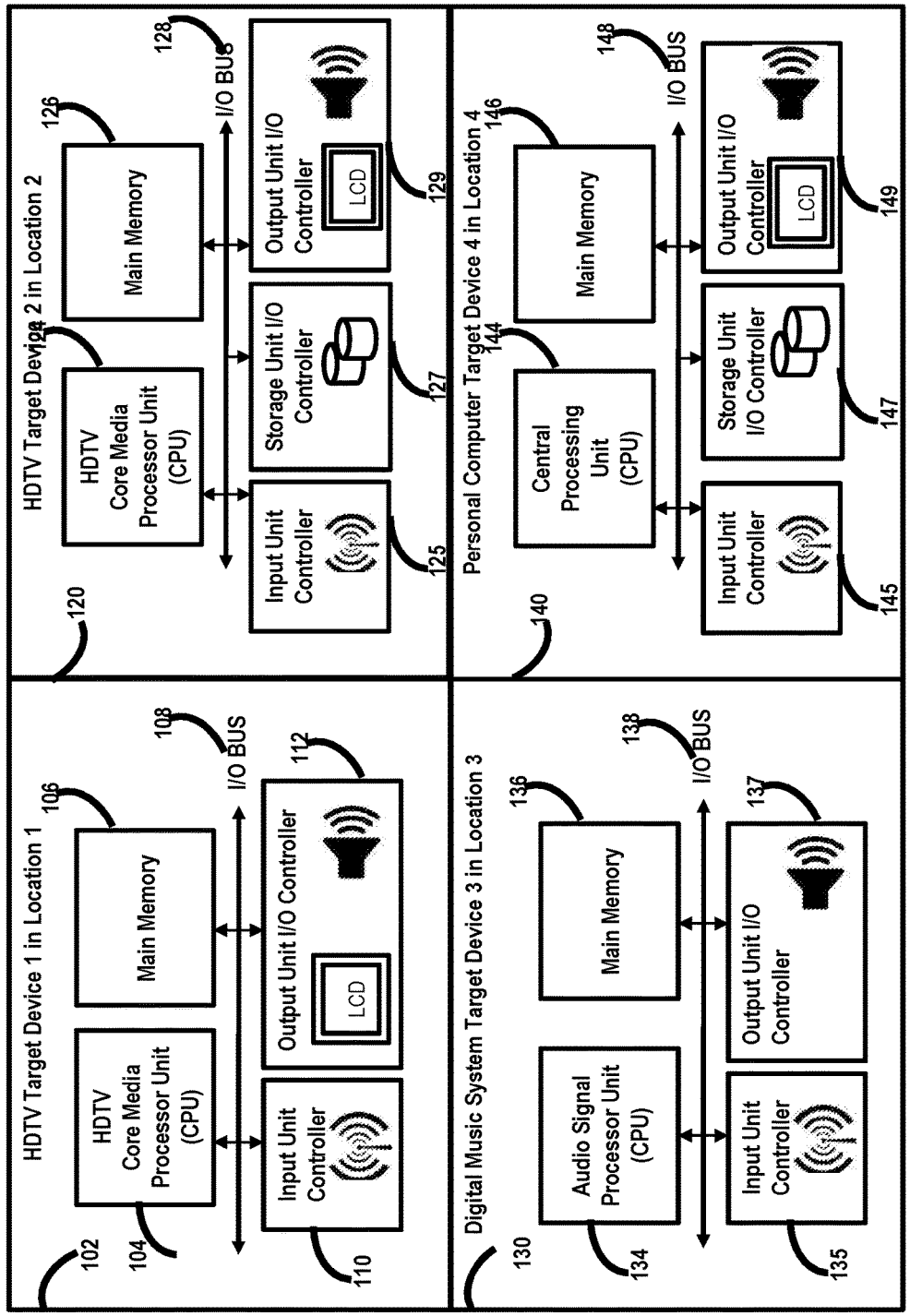
FIG. 1 is a block diagram of a prior art of location based digital multimedia target devices including HDTV, music system, personal computer (PC) for possible use in conjunction with the system and method of the present invention.

Before describing the preferred embodiment in detail, a description of some of the terms used herein may assist the reader to understand the present invention.

DISCOVERY: The smart personal device enables a user to select a discovery mode from which the smart personal device will discover target devices which are capable of being interacted by the smart personal device. The discovery method currently contemplated comprises, but is not limited to, using any one or more of the following: RFID, wireless, powerline, FM, LAN, USB networking communication media. The preferred embodiment of the present invention is described in the context of discovering a RFID device which is built within or associated with each target device while a smart personal device is located proximate to the target device. During the discovery process, the smart personal device initiates all its tasks and performs all functions while target device can be passive and its main electronics other than the minimal components may be powered off or in low power sleep mode other than the minimal functions including but not limited to the RFID and Wake on LAN or Wake on USB. Once the smart personal device identifies a suitable target device located proximate to the smart personal device, it will register the target device and its functional characteristics such as TV, HDTV, DVR, Music systems in the smart personal device's configuration table. The smart personal device at its option, depending on its programming and user and/or system preferences and requirements may perform a quick test to confirm the target device's capability even if the target device is in active operation without disrupting any user action to confirm the target device's capability. During the quick test, If the target device is powered off or in a low power sleep state, the smart personal device can wake up the target device by using an industry standard method including but not limited to wake on LAN or wake on USB method. The smart personal device is capable to perform rediscovery update operation either upon user's selection or perform at a fix interval to detect if there is any new target device since the last discovery operation. If a new target device is discovered the smart personal device will alert the user and enable the user to choose to ignore or to add the newly discovered target device to the configuration table. A target device may include a configuration option for not be discovered or only be discovered and registered by if the smart personal device meets certain parameters including but not limited to authorize by user, by device type, by password, by functionality.

REGISTRATION or REGISTERING: Upon a successful discovery of a target device, the smart personal device is capable of registering relevant characteristic of the target device by storing in the configuration table of the smart personal device. The relevant characteristic of the target device may include but not be limited to brand, model, maker, MAC ID, CPU speed, main memory size, disk storage size and type, network capability, smart Direct I/O capability, GPS location, input I/O type, output I/O type. Once registered, the target device is available to be woken from a low power sleep state and ready to perform operation upon command including but not limited to receive and display content or to transfer content to the smart personal device. The present invention uses the smart personal device to perform all the necessary discovery and registration tasks independent of the target device while the target device is passive or in a low power sleep mode. In an alternative embodiment, the discovery and registration steps can be easily performed with active participation by the smart personal device and target device. In one embodiment of a related invention the target device performs the role of Discovery and Registration whereby the target device identifies a smart personal device located proximate to the target device and performs all operations to discover and register the smart personal device while the smart personal device is passive till the target device activates the smart personal device.

ACTIVATION: Once the smart personal device identifies a target device located proximate to the smart personal device and confirms in the configuration table that it is a valid and registered target device, it will automatically perform a wakeup commands to the target device without the awareness of the user. In addition, if the smart personal device is being used by the user to perform an ongoing live operation including but not limited to a Windows or MAC or Google application such as word processing, windows office, playing music, video playback, TV broadcasting program, internet related operations such as search, news, blogs, purchase, etc., the smart personal device will command the target device to instantaneous switch from the low power sleep state to an active state to perform I/O operations on the target device. The present invention will enable the target device, if it's already performing an operation, to automatically perform a split screen if the target device includes a display unit and has the split screen capability. One or more target devices may be activated at the same time within proximate to the smart personal device, i.e. PC and printer, HDTV and DVR.

DELIVERY CONTENTS: Contents are delivered from the smart personal device to one or more target devices via various means including but not limed to wireless Ethernet 802.11 G/B/N/A, USB wireless, mobile phone wireless, powerline, RF, FM etc. In one embodiment of the present invention, the content is delivered from the smart personal device to the target device using one of the target device's input unit controllers. If the target device is a HDTV, the input unit controller is capable of receiving content from input source including but not limited to antenna, cable, wireless LAN, RF, FM, LAN, wireless USB. If HDTV comprises a HDTV Core Media Processor than its CPU, main memory, output unit controller will be activated to receive the content from the smart personal device using its input unit controller, transmit the content to the CPU/main memory using the I/O BUS. After the CPU process the content, it will transfer the content to the output unit controller using the I/O BUS and the output unit controller will display the content on the target device. In this embodiment, the majority of the digital logic will be powered to perform the function.

In another embodiment, whereas the target device comprising smart input I/O controller and smart output I/O controller, once the target device is being activated by the smart personal device and properly configured by the Direct IO manager of the target device, the smart input I/O unit controller is capable of receiving the content from the smart personal device and deliver the content directly to the output I/O unit controller using the I/O BUS independent of the Core Media Processor and Main Memory. In addition, in this embodiment of Direct I/O method, the Core Media Processor and Main Memory can be turned off or to be in a low power sleep mode thus significantly reducing power required for the operation. This Direct I/O method may be enabled in devices including but not limited to HDTV, Music systems, Personal Computers or target device comprising at least one smart Input unit controller, one smart storage unit controller and one smart output unit controller.

In another embodiment, when the smart personal device is leaving one target device and arriving at a different target device, the smart personal device upon detection of it is no longer proximate to the first target device it will automatically store the content in a temporary buffer or storage unit and suspend the content delivery to the target device by marking or bookmarking the current position using the intelligence on the smart personal device unit. Upon identifying a new target device or back to the original target device located proximate to the smart personal device, it will first deliver the content from its temporary buffer or storage unit therefore there is no interruption or loss of the content while the user is transitioning from one target device location to the next by resuming the content delivery from the previously marked or bookmarked position.

The present invention describes content delivery from the smart personal device to a first HDTV target device and redirect the content to a second HDTV target device whereby the target device located proximate to the smart personal device. In another embodiment of the present invention the smart personal device is receiving a live digital FM broadcasting contents while delivering the FM broadcasting contents to a digital speaker system (Target device #1) in a home location on network #1. When the user is leaving the above described home location and entering in a second location i.e. an automobile with a digital speaker system, the smart personal device will first deactivate the first target device on network #1 when the first target device is no longer proximate to the smart personal Device (the first time), automatically start storing or recording the content from the FM broadcasting on its storage unit. Upon identifying the digital speaker system (Target device #2) in the automobile on network #2 located proximate to the smart personal device (the second time), it will activate the target device #2 and resume the content delivery from the previous stored content while continuing storing or recording the current FM broadcasting content. In the above embodiment, the network #1 whereas the smart personal device and the target device communicate by means may include but not limited to a wireless Ethernet network. However the network #2 is a different network from the network #1 whereas the smart personal device and target device #2 communicate by means may include but not limited to a Bluetooth network.

In yet another embodiment, the smart personal device upon user's selection is capable of waking up one of more target devices from the low power sleep state and performs content search operation of its neighboring target devices which has been enabled for such actions. Once the matching criteria is found, the smart personal device will "pull" such content from its neighboring target devices and store on the local storage of the smart personal device without interrupting its current operation of either device. The transfer of the content can be performed using the CPU, memory and the I/O BUS of the neighboring target devices, or if the neighboring target device comprises smart I/O controllers, the transfer of content can optionally be performed using a Direct I/O method of transferring content from the smart storage unit I/O controller to the smart network unit I/O controller of the target device's CPU and memory. i.e. under the program control of its Direct I/O Manager, content is transferred from the smart storage unit I/O controller to the network unit I/O controller using the I/O BUS independent of its CPU and main memory. Then the network unit I/O controller transfers the content to the storage unit I/O controller of the smart personal device. The smart personal device with the smart I/O controller have the option to directly transfer the content from its smart network unit I/O controller to the smart storage I/O unit controller independent of its CPU and main memory operate effective under control of the Direct I/O Manager. The Direct I/O method improves the speed performance and reduces power consumption of the device since the CPU and main memory are not active during the content transfer operation. Upon completion, the smart personal device will alert the user that such contents are ready for display at user's convenience.

In yet another embodiment, the present invention may, upon its user's command, using "pull" method amongst neighboring target devices as well as content host target devices across the internet; instead of having contents, such as web advertisements, being "pushed" onto the smart personal device without the consent of the user, the smart personal device will operate effectively to block all non-authorized intrusive contents from displaying on the smart personal device or target devices without the consent of the user; instead it offers user an option to specify a desire content criteria for the smart personal device to perform search directly, or indirectly through another intermediary web based service on user's specified criteria. Once the relevant criteria are found, a matched content list will be generated by the smart personal device to enable the user to review the list at one's convenience. If the user elects to view one or more (or all) of the match content from the list, the smart personal device is operable effective to PULL the selected content from the storage area of the various content hosts, which may be over the Internet or target device in its LAN environment. After the completion of the PULL steps, content such as web advertisement is stored onto the storage I/O unit controller of the smart personal device for display at user's convenience. The present invention using "pull content" method for web advertisements over internet as an example, such invention may apply to a variety of contents over the Internet including but not limited to pull relevant books content, relevant news content, relevant sales contents, relevant advertisement promotion through the use of banners, widgets, etc. and user-specified web target services and information sources including but not limited to google.com, facebook.com, youtube.com, amazon.com, uspto.gov, etc.

DEACTIVATION: When the smart personal device is no longer proximate to the target device, the target device will automatically be deactivated by the smart personal device in the present invention so the underlining data processing logic including but not limited to the media CPU, main memory, input and output controllers and associated input and output devices and resume in a low power sleep state. Once the target device enters in the low power sleep state the only function running under the low power sleep state is the activation detection logic comprising, but not limited to, RFID, proximity sensor, wake on LAN, and wake on USB units. In one embodiment of a related invention, the target device performs the role of deactivation whereby the target device identifies a smart personal device is no longer located proximate to the target device and performs all operations to deactivate the underlining data processing logic including but not limited to the media CPU, main memory, input and output controllers and associated input and output devices and resume in a low power sleep state.

Having provided a description of some of the relevant terms used in this description, the remaining portion of this section will describe the illustrations of the present invention.

A typical, well-known, system includes one or more target devices which comprising a plurality of digital multimedia data processing systems within a home environment as a prior art of the present invention that can be used are illustrated diagrammatically in FIG. 1. FIG. 1 illustrates multiple target devices in different locations and each target device may deliver unique, different content and employ a different user interface to a user. The FIG. 1 comprises a HDTV 1 target device which is located in room 1 block 102, within block 102 comprises HDTV home target device1 is a HDTV where it is physically located in location 1. The HDTV target device1 block 102 comprises a HDTV Core Media Processor unit (CPU) 104, main memory unit 106, input unit controller 110, output unit I/O controller and an I/O bus 108 connected to each unit 104, 106, 110, and 112. The HDTV target device1, 120 comprises a HDTV Core Media Processor unit (CPU) 124, main memory unit 126, input unit controller 125, output unit I/O controller 129, storage unit I/O controller 127 and an I/O bus 128 which connects by each unit 124, 126, 125, 127 and 129. The Music System target device3 130 comprises an Audio Signal Processor unit (CPU) 134, main memory unit 132, input unit controller 135, output unit I/O controller 137, and an I/O bus 138 which connects by each unit 134, 136, 135, and 139. The Personal Computer target device4 140 comprises a Central Processor unit (CPU) 144, main memory unit 146, input unit controller 145, storage unit I/O controller 147, output unit I/O controller 149 and an I/O bus 148 which connects by each unit 144, 146, 145, 147 and 149. The input unit controller 110, 125, 135, 145 are capable of receiving signal which comprise the contents from one or more signal sources but not limited TV antenna, wireless Local Area Network (LAN). Each target device receive contents from the input unit controller, deliver the content to the output unit I/O controller using the I/O bus or at its option with or without the user's option to store the content in its storage unit I/O controller for later delivery. One common characteristic for all target devices in FIG. 1 is that all contents are received and delivered locally or stored locally at or near the physical presence of the target device for later access by the user on the target device apparatus. This restrict a user to access of all or any of the contents within certain fixed physical distance limitation of the target device FIG. 2 is an exemplary system embodiment of a smart personal device 240 being used in conjunction with a plurality of target devices in the present invention.

Figure 2:
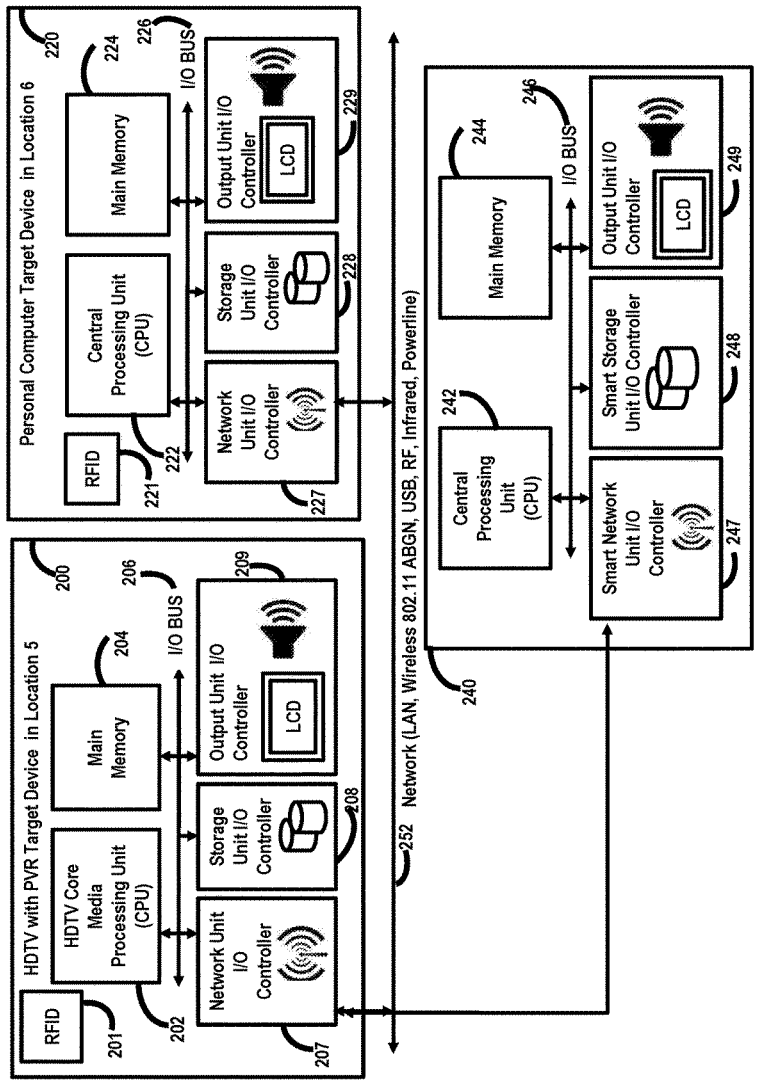
FIG. 2 is a block diagram of the exemplary system embodiment of a smart personal device and target device communication environment which is used in accordance with the present invention.

In the illustrated embodiment of FIG. 2 a smart personal device 240 is connected with a HDTV with DVR target device in location 5, 200 and a Personal Computer target device in location 6, block 220 whereas as device 200, 220 and 240 are attached to a network 252. Network 252 in the exemplary system embodiment may include but not limited to a wireless 802.11 ABGN communication network which conforms to a standard communications protocol such as 802.11a, b, g or n, a USB, a RF communication system, an infrared, a Bluetooth, or a powerline-based communication network. The target device in location 5, 200 includes a central processing unit (CPU) 202, main memory 204, network unit I/O controller 207, storage unit I/O controller 208, output unit I/O controller 209, all of which are interconnected with I/O bus 206. The target device 200 also includes a RFID component 201 which enables the smart personal device 204 to perform the discovery, and register steps described above. The remaining functional components 202, 204, 206, 207, 208, and 209 work in conjunction with the smart personal device 240 to perform the steps of activation, content delivery, deactivation and content pull mode as shown with FIGS. 4, 6, and 8. Within the target device in location 6, 220, the central processing unit (CPU) 222, main memory 224, network unit I/O controller 227, storage unit I/O controller 228, output unit I/O controller 229 are interconnect with I/O bus 226 and a RFID component 221 which enables the smart personal device 204 to discovery and register steps of device 220. The remaining functional components 222, 224, 226, 227, 228, and 229 work in conjunction with the smart personal device 240 to perform the steps of activation, content delivery, deactivation and content pull mode as shown with FIG. 4, 6.

FIG. 3A is an exemplary system embodiment of a smart personal device to be used in conjunction with a plurality of target devices in the present invention. In the illustrated embodiment 3A comprises a central processing unit (CPU) 302, main memory 304, network unit I/O controller 306, storage unit I/O controller 312, output unit I/O controller 308 and each units are interconnected with I/O bus 310. The main memory 304 may comprises a dynamic RAM whereas the storage unit I/O controller may comprises non-volatile storage including but not limited to IDE, SCSI, SATA, NAND, SD storage types.

FIG. 3B contains the same components 302, 304, 310 as discussed in FIG. 3A with the addition of a Direct I/O manger 360 and smart network unit I/O controller 350 and smart storage unit I/O controller 352 and smart output unit I/O controller 308. Duo to the high definition and high data rate requirements of these smart personal device, the I/O units 350, 352, 358 in FIG. 3B of the present invention may including busmaster capability which is an industry standard implementation for an I/O device to request and to take control as the master of an I/O bus to provide at least certain address, control and data signals to direct transfer content between the main memory 304 and respective I/O units, independent of the CPU 302 effective under program control using the I/O bus 310; In the event of transferring bulk content i.e. a digital movie, the smart personal device in FIG. 3B may invoke a Direct I/O transfer mode wherein effective under program control of the Direct I/O Manager 560 to transferring content directly between a pair of said I/O units via said I/O bus as show in 360a and 360b, bypassing the main memory an independent of the CPU. The Direct I/O Manager 560 is operable to enable the Direct I/O Mode under program control for a target device improves not only the content transfer speed of the target device but also reduces the power consumption of the CPU and Memory since these units area bypassed and inactive during the duration of content transfer. FIG. 3B upon set up by the direct I/O manager 360 under program control is operable to directly one of more direct transfer path across the I/O bus 310 and delivery bulk contents from the smart network unit I/O controller to the smart storage unit I/O controller by only transfer the content across once as shown with data path 360a using the I/O bus 310. The Direct I/O manager is capable of simultaneously enabling one or more such direct I/O operation pair across the I/O bus 310 as shown with data path 360b wherein upon program control of direct I/O manager 360, the smart storage unit I/O controller is capable of transferring bulk data to smart output unit I/O controller once across the I/O bus 310, independent of the CPU 302 and main memory 304. The direct I/O does not increase content delivery data rate but more significantly, by bypassing the CPU 302 and memory 304 while performing the bulk data transfer, it significantly reduces the power consumption of the target device.

With reference additionally now to FIG. 4, a logic flowchart representing a system and method for performing by the smart personal device to discovery, registration, activation, content delivery, and deactivation of a target device. Upon enablement by a user, the smart personal device start the discovery step as shown in block 405 whereas the smart personal device scans all available devices, and control devices i.e. cable modems, DSL router, Cable modem, DHCP configuration to determine past and current devices and any available configurations existed on networks. The smart personal device is then required to scan any current target devices from one location to another by physically moving the smart personal device from one location to another so the smart personal device identifies one or more target devices located proximate to the smart personal device uses its proximity sending device including but not limited to the RFID sensor.

Once the discovery steps are completed, the smart personal device as shown in block 410 will register all discovered target devices, including one or more discovered target devices which cannot be enabled for the instant invention and one or more discovered target devices which are capable of performing at least one function of the Instant invention. After the steps of block 410, the smart personal device enters in a state to identify a Registered target device Located Proximate to the smart personal device as show in block 415. As shown in block 420 whereby the smart personal device identifies a registered target device and based on the user's desire to transfer content to such target device. The smart personal device proceed to perform Activation steps by remotely waking up the target device if the target devices in a low power sleep state or remotely configure the target device to have a split screen mode if the target device is currently being used by another user and if the target device is capable to such split screen operation.

After block 420, the smart personal device and the target device are operable in the content delivery mode as shown by block 430 while the smart personal device is proximate to the target device. The contents can be sourced from the smart personal device for the target device to receive and display or to receive and store, or to receive and store and display on its output unit. In a reverse direction whereas the content is sourced from the target device for the smart personal device to receive and either display or store in its storage unit or both.

If and when the smart personal device and the target device which is capable of performing the direct I/O mode under the program control of its Direct I/O manager as shown by block 460 to enhance bulk content transfer by transferring the content once across its I/O bus independent of its CPU and memory with the added benefit of increased bulk content data rate while reducing power consumption of the device, Block 460 will enable the direct I/O to perform such operation.

At the completion of the content delivery steps and if the smart personal device has no further usage of the target device, the smart personal device will deactivate the target device as shown in block 480. Upon completion of block 480, the smart personal device will return to Block 415 ready state for further required operation from the user. In the event of the smart personal device is no longer located proximate of the target device while operating under the steps of FIG. 4, the smart personal device will deactivate the current target device as shown in block 480 and operating under the logic flowchart representing a system and method steps presented in FIG. 6 below.

Figure 5:
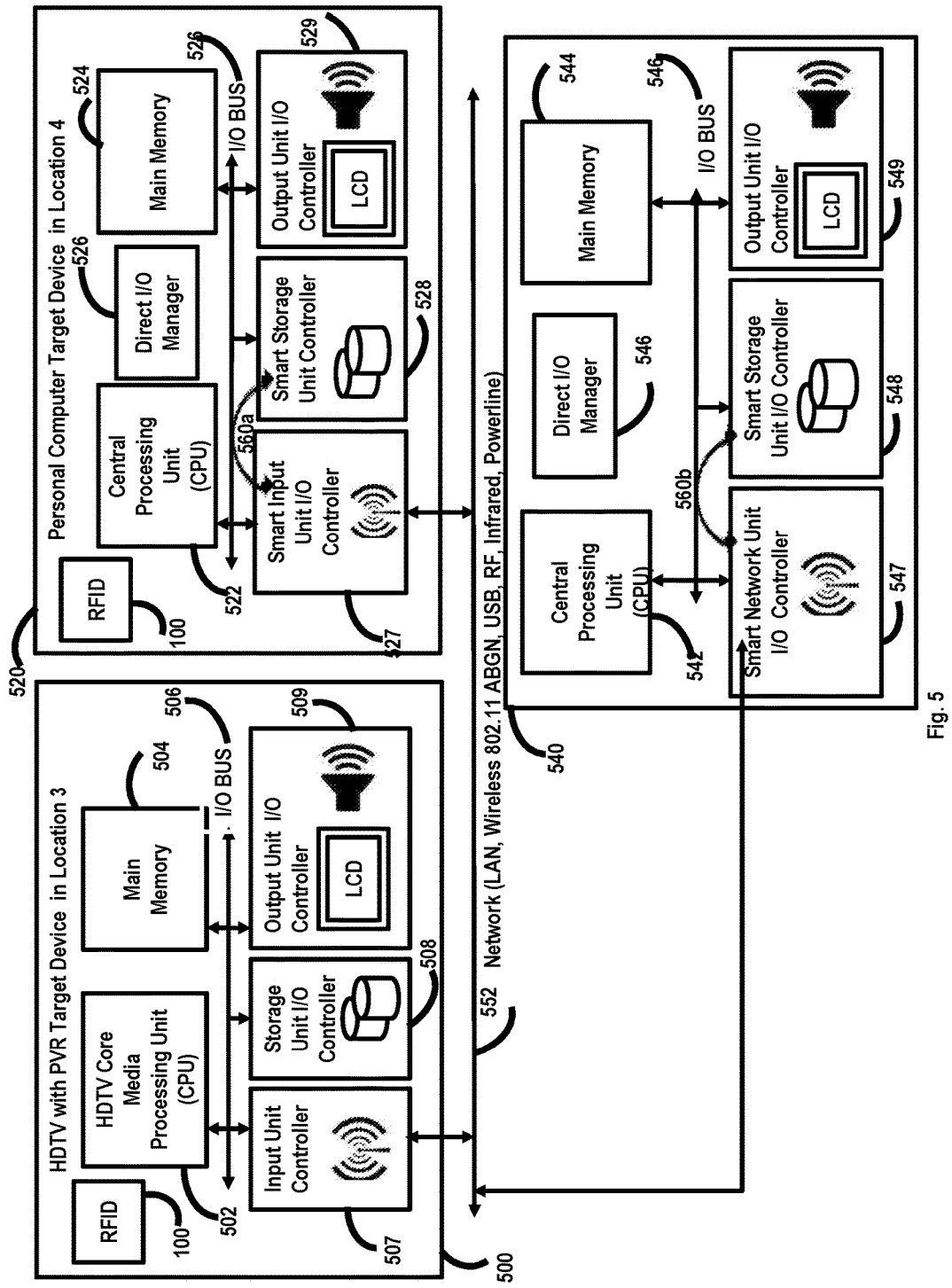
FIG. 5 is a block diagram of the exemplary system embodiment of a smart personal device and multiple digital multimedia devices which are enabled with Direct I/O described in accordance with the present invention.

FIG. 5 is an exemplary system embodiment of a smart personal device 540, a HDTV with PVR target device in location 3 as show block 500 and a Personal Computer target device in Location 4 as shown in bock 520; and each device is connected with a communication network block 522. The smart personal device 540 which has all the capability of the smart personal device 240 as shown in FIG. 2 with additional Direct I/O Mode capability which effective operates under program control of Direct I/O Manager block 546 to direct transfer content from block 547 and block 548 across only once using the I/O bus 546 independent of the CPU block 542 and main memory 544. Due to the high definition and high data rate requirements of these smart personal device, the I/O units 572, 548, and 549 in block 540 of the present invention may include busmaster capability to directly transfer content between the main memory 544 and respective I/O units, independent of the CPU 542 effective under program control using the I/O bus 546; In the event of transferring bulk content i.e. a digital movie, the smart personal device block 540 may invoke a Direct I/O transfer mode wherein effective under program control of the Direct I/O Manager 546 to transferring content directly between a pair of said I/O units via said I/O bus as show in 560b, bypassing the main memory an independent of the CPU. Using the Direct I/O Mode for a target device improves not only the content transfer speed of the target device but also reduces the power consumption of the CPU and Memory since these units area bypassed and inactive during the duration of content transfer. The Personal Computer target device in Location 4 as shown in bock 520 which is similar to the target device in block 240 in FIG. 2 with the additional Direct I/O Mode capability which effective operates under program control of Direct I/O Manager block 546 to direct transfer content from block 547 and block 548 across only once using the I/O bus 526 independent of the CPU block 522 and main memory 524. target device 520 of the present invention is operable to meet the high definition and high data rate requirements as its I/O units 572, 528, and 529 in location 4 may including busmaster capability to direct transfer content between the main memory 424 and respective I/O units, independent of the CPU 522 effective under program control using the I/O bus 526; In the event of transferring bulk content i.e. a digital movie, the target device in location 4 block 520 may invoke a Direct I/O transfer mode wherein effective under program control of the Direct I/O Manager 526 to transferring content directly between a pair of said I/O units via said I/O bus as show in 560a, bypassing the main memory an independent of the CPU. Using the Direct I/O Mode for a target device improves not only the content transfer speed of the target device but also reduces the power consumption of the CPU and Memory since these units area bypassed and inactive during the duration of content transfer.

Figure 6:
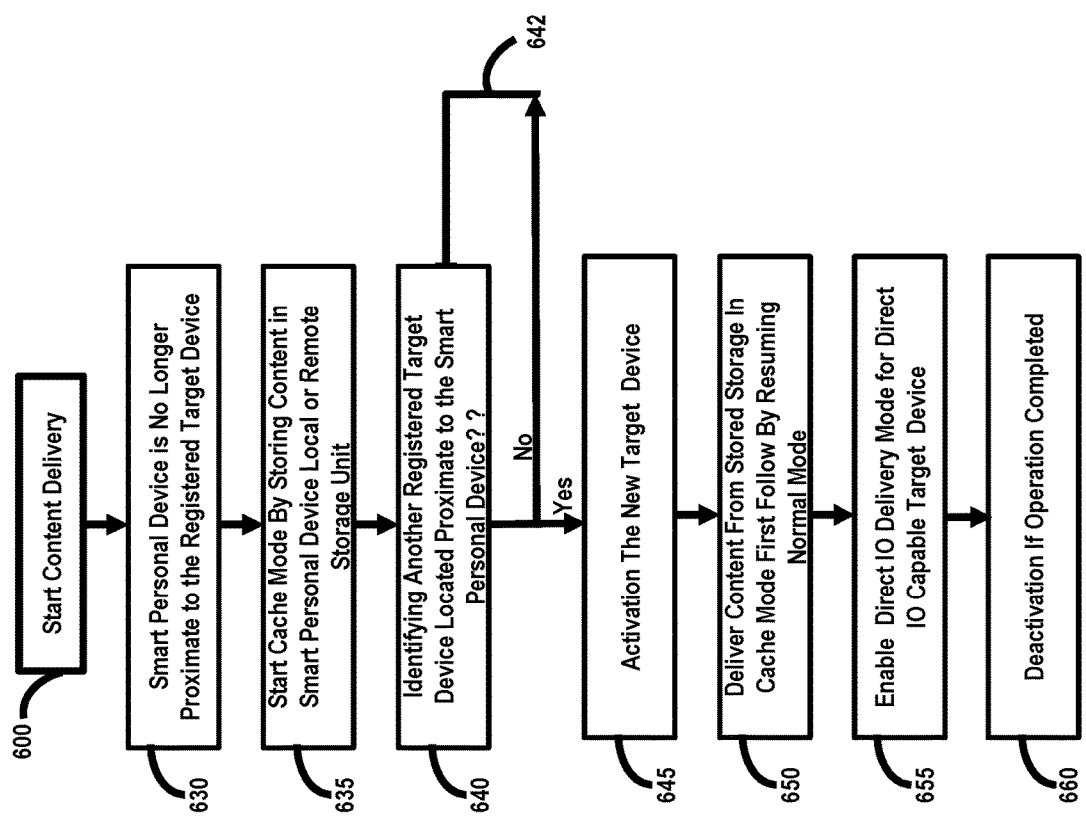
FIG. 6 is a flow diagram of the Instant invention illustrating one flow of interaction of a smart personal device transitioning from a first target device in one location to a second target device in a different location.

FIG. 6 is a flow diagram of the Instant invention illustrating one flow of interaction of a smart personal device transitioning from a first target device in one location to a second target device in a different location. As shown by block 600 of FIG. 6 and the smart personal device is delivering content to a target device and it detects that the smart personal device is no longer proximate to the registered target device as shown by Block 630, The smart personal device may automatically enters a Transparent Cache Mode whereby the smart personal device stores the ongoing live content in its local storage including but not limited to IDE, ATA, SATA hard disk drive media or USB, NAND, FLASH mass storage device or remotely to a storage medium remote from the smart personal device such as on the network or a removable storage area as shown by block 635 without user intervention. This Transparent Cache Mode will continue as show by block 640 till the smart personal device identifies another registered target device located proximate to the smart personal device with similar content delivery capability of the previous target device or the prior target device itself as shown by block 640. At such time, the smart personal device will automatically without user intervention to activate the new target device as shown by block 645 followed by delivering content from stored storage from the beginning of the stored content under the Transparent Cache Mode as shown in block 650 while the new target device is located proximate to the smart personal device till it reaches the end of the stored content of the Transparent Cache Mode cache content. The smart personal device of the present invention under the block 650 may simultaneously deliver cached content to the new target device and continually storing content under the Transparent Cache Mode as long as there is stored content of the Transparent Cache Mode which is not yet delivered to the target device. As shown in block 655, If the smart personal device detects either the target device or the smart personal device or both are Direct I/O capable device, it will under program control to activate the Direct I/O manager to enabled the Direct I/O delivery mode for these devices.

An exemplified system and method of the present invention illustrates the steps of the FIG. 6 including but not limited to a user moving around from room #1 to room #2. While the smart personal device identifies a first registered target device located proximate to the smart personal device at a first time and delivers content to a HDTV target device #1 in room #1 while the smart personal device is proximate to the target device #1. When the smart personal device is no longer proximate to the target device #1 at the second time, the smart personal device suspends the delivery to the target device #1 and marks the content is not delivered including but not limited to save the current location of the content or place a bookmark to indicate what content has been delivered and what content has yet to be delivered. When the smart personal device identifies a second registered target device (a Personal Computer #2 of room #2) located proximate to the smart personal device at a second time, the smart personal device activates the new target device and resumes delivering the remaining content or previously marked content starting from the bookmark location while the smart personal device is proximate to the new target device. Another embodiment of the present invention illustrates the steps of the FIG. 6 including but not limited to a user listens to the content of a Digital Music System (Target device #3) in one's home whereby the target Device #3 is a registered target device of the smart personal device and is located proximate to the smart personal device whereby content was provided by a FM digital content provider and being received by smart personal device without the need to store the content on the storage area of the smart personal device and delivered to the target device #3 while the smart personal device is proximate to the target device #3. The user leaves the home location and enter in user's automobile which has a registered digital speaker system (Target device #4) with the smart personal device and such that the new target device #4 has similar capability of receiving the content as of the target device #3. While the user is leaving his home and entering the automobile, the smart personal device in the present invention has identified that the target device #3 is no longer proximate to the smart personal device, it deactivates the target device #3 and entered the Transparent Cache Mode without user action and stores FM broadcasting content at the time. At a later time when the smart personal device identifies the target devices #4 located proximate to the smart personal device, it automatically activate the speaker system in the automobile without user action and deliver the stored content to the target device #4 without interruption to the FM broadcasting content.

Figure 7:
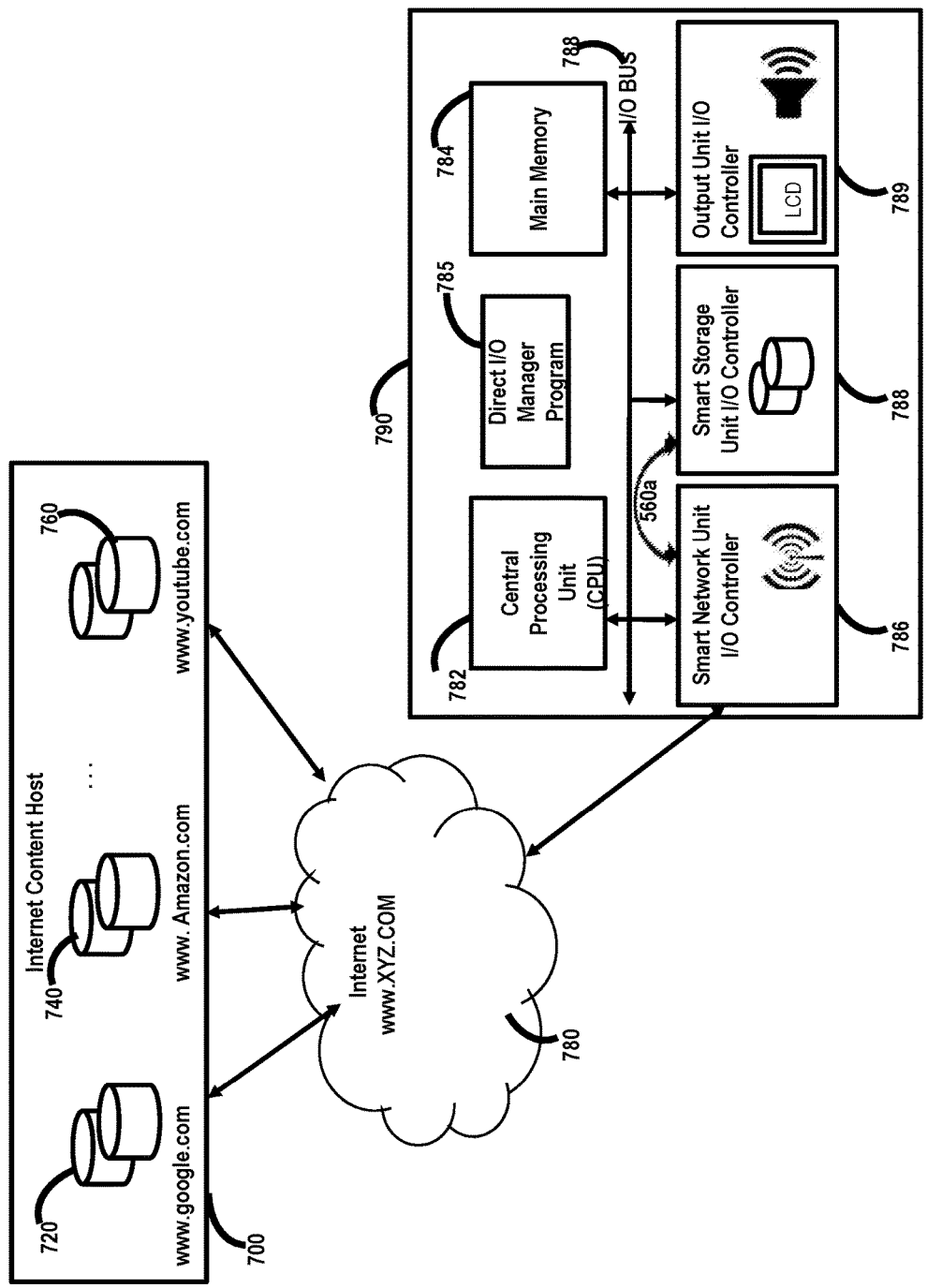
FIG. 7 is a block diagram of the exemplary system embodiment of a smart personal device and a remote Internet content host which are enabled with Direct I/O content Pull mode in accordance with the present invention.

With the presence of Internet content host and web based retailers such as ebay.com and amazon.com, there is a prolific presence of web based advertisement, in the forms of banners, widgets, whereby advertisement campaign pushes these contents to device and being displayed on a specific area of the output devices i.e. CRT, LCD, HDTV of a device including but not limited to a smart phone, a personal computer while a user accessing contents from the Internet without consent of the user. Some of these advertisement contents may be interesting to a user however the majority of these web based advertisement are disruptive and each takes away productive time and processing resources away from the user. The present invention overcomes these pushed intrusions by enabling the user to specify a finite set of criteria for the Smart Device to first search relevant content hosts over the Internet directly or using an intermediary web services to do so. Once a desirable content is found, the smart personal device will build a match content list and store the match content list on the smart personal device for the user to access at one's convenience. Once a content within the matched list is selected by the user, the smart personal device will be operated to "pull" these selected content from the content hosts and store the matched content on the storage unit of the smart personal device for the user to access it at user's convenience either directly on the smart personal device or access these contents on one or more of the target devices. In one embodiment of the present invention, the stored content will be displayed only on the target location of the output display device as if the content is being pushed by the advertisement campaign. In another embodiment of the present invention, the matched content is being reorganized by the smart personal device so the user can access them without the restriction being shown at the original target location. An exemplified system and method of the present invention illustrates in FIG. 7 including a smart personal device block 790 comprising a CPU 782, Main Memory 784, smart network unit I/O controller 786, smart storage unit I/O controller, output unit I/O controller 789 and each is connected by the I/O bus 788; The smart personal device 790 is further connected to Internet block 780 using including but not limited to a wi-fi network or an Internet service provider's data network including but not limited to dial-up, DSL, Broadband wireless access, cable internet, ISDN while accessing Internet content hosts including but not limited to block 720, 740, 760 and service providers.

Figure 8:
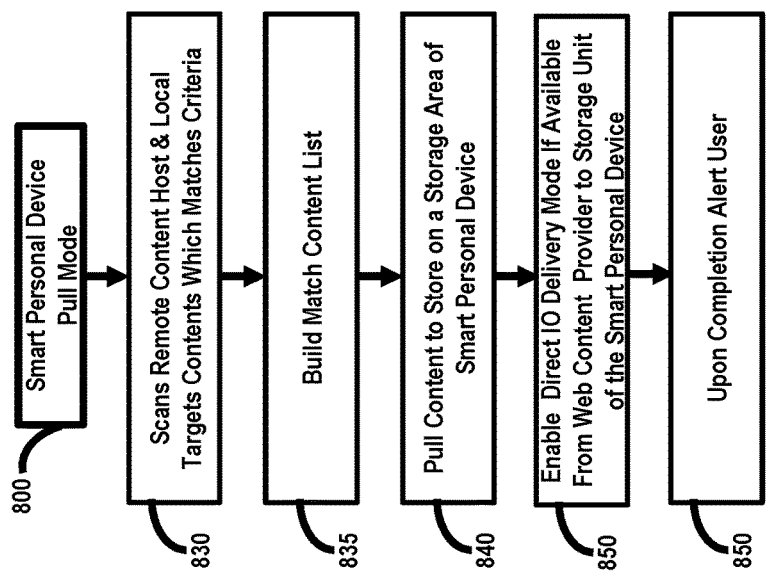
FIG. 8 is a flow diagram of the Instant invention illustrating one flow of interaction between a smart personal device using a PULL mode with remote content host and local multiple target devices.

With reference additionally now to FIG. 8, a logic flowchart representing a system and method for performing the Pull Mode by the smart personal device. Upon enablement by a user as shown on block 830, the smart personal device start to scan Internet content host which is remotely located over the Internet and local target device for contents which matches the selection criteria i.e. sales on a specific automobile, specific tools, travel discounts to a specific destination . . . etc. Once one of more matches are found, the smart personal device builds a Match Content List as shown on block 835 and "pull" the match content and store the content on a storage area of its local storage unit or store the content on a removable and network storage which can be accessed by the smart personal device Block 840. If the smart personal device is enabled with the Direct I/O Delivery Mode, Block 850, the smart personal device will under program control to activate the Direct I/O manager 785 to enabled the Direct I/O delivery mode for pulling these match content from block 786 to block 788 across the I/O Bus 728 only once as shown by block 560a independent of the CPU 782 and main memory 784.

Those skilled in the art will understand that the present invention has been described in illustrative form only and that many modifications are possible without departing from the spirit of the present invention. For example, smart personal device of the present invention is a hardware and software components which includes integrated or embedded with a portable device including but not limited to a smart phone, a personal computer, a laptop, a netbook, a GPS, a personal multimedia player, video MP3 player, a portable radio or a tablet PC. A smart personal device can as well be a standalone, special purpose device which comprises one or more of the features described in the above paragraphs either alone or in a combination of other features. Additionally, features include advertisement sifting system and method for matched content, turning off power for these target device no longer in proximate of the smart personal device are invention which can either alone or in a combination of other features. Those skilled in the art will also appreciate that some of the features described can be employed to advantage without the corresponding use of other features. For example, the use of RFID is desirable for discovering a target device, though not required if the smart personal device is equipped with the use of a pattern recognition feature, or an optical component, or a bar code component either alone or in combination with the use of the RFID component to discover a target device. It will be understood that the present invention is described in connection with various systems such as communications protocols which are in use today, but the present invention is not restricted to the presently-used communications protocols. Also, many additional features can be added to the present invention including but not limited to a usage timer which meters either the time used on the smart device by the user, or the network bandwidth used for delivering content, a storage used to store the content . . . etc. In addition, actions taken when the smart personal device located proximate to the target device can include or replace with a location specific feature such a GPS. Accordingly, the foregoing description should be considered as merely a description of the present invention and not in limitation of it, as the scope of the present invention is defined by the claims which follow.

The invention claimed is:

1. A data processing apparatus, comprising:
   a processor, a storage device, an output unit, and a proximity detection circuit, which are collectively coupled for receiving content related to target devices;
   the storage device is coupled to the processor, for storing at least:
     a first content, and a second content; and
     target device characteristics, including a characteristic of a first target device and a characteristic of a second target device;
   the proximity detection circuit to detect proximity of the first target device and provide to the processor a first target device indication indicating the proximity of the target device, and to cease providing the first target device indication when the proximity of the target device is not detected;
   the proximity detection circuit to detect proximity of the second target device and provide to the processor a second target device indication indicating the proximity of the target device, and to cease providing the second target device indication when the proximity of the second target device is not detected;
   the processor receiving a user's desire to receive and display at least one of the first content and the second content;
   the processor receiving the first content, including the characteristic of the first target device, and displaying the first content to the output unit upon receiving the first target device indication, and then to cease to display the first content in the absence of the first target indication; and
   the processor receiving the second content, including the characteristic of the second target device, and displaying the second content to the output unit upon receiving the second target device indication, and then to cease to display the second content in the absence of the second target indication.

2. The apparatus of claim 1, wherein the characteristic of the first target device includes an advertisement information of the first target device, and the characteristic of the second target device includes an advertisement information of the second target device.

3. The apparatus of claim 1, wherein the storage device is local and coupled to the processor via a local bus.

4. The apparatus of claim 1, wherein the storage device is remote and coupled to the processor via a network.

5. A data processing apparatus, comprising:
   a processor, a storage device, an output unit, and a proximity detection circuit, which are collectively coupled for communicating content with a target device;
   the storage device is coupled to the processor, and for storing at least:
     a content, at least some of the content is stored in a buffer before being communicated to the target device; and
     target device characteristics, including a characteristic of the target device is registered for communication with the processor;
   the proximity detection circuit to detect proximity to the target device and provide to the processor a target device indication indicating the proximity of the target device, and to cease providing the target device indication when the proximity of the target device is not detected; and
   the processor causing the content to be communicated from the storage device to the output unit and upon receiving the target device indication and a signal indicating a user's desire to transfer the content to the target device, the processor suspending the communication of the content only to the output unit and then transferring at least some of the content to the target device in accordance with the characteristic of the target device, and the content from the storage device for displaying on the target device.

6. The apparatus of claim 5, wherein the signal comes from the data processing apparatus.

7. The apparatus of claim 5, wherein the signal comes from the target device.

8. The apparatus of claim 5, wherein the data processing apparatus is storing some of the content in the buffer while suspending the communication of the content only to the output unit.

9. The apparatus of claim 8, wherein at least some of the said content stored in the buffer is included with the content being transferred to the target device.

10. The apparatus of claim 5 wherein the data processing apparatus is storing some of the content in the buffer while transferring the content to the target device.

11. The apparatus of claim 10, wherein at least some of the said content stored in the buffer is included with the content being transferred to the target device.

12. The apparatus of claim 5, wherein the storage device is local and coupled to the processor via a local bus.

13. The apparatus of claim 5, wherein the storage device is remote and coupled to the processor via a network.

14. A data processing apparatus, comprising:
   a processor, a storage device, an output unit, and a proximity sensor, which are collectively coupled for communicating content with a target device;
   wherein the storage device is coupled to the processor, and for storing at least a content;
   wherein the proximity sensor is capable to detect proximity to the target device and provides to the processor a target device indication indicating the proximity of the target device, and ceases providing the target device indication when the proximity of the target device is not detected;
   wherein the processor accesses at least some of the content from the storage device and transfers it to the output unit for display;
   wherein, upon receiving the target device indication and a first signal indicating a user's desire to transfer at least some of the content to the target device, the processor ceases transferring the content only to the output unit and instead transfers at least some of the content to the target device; and wherein, upon later receiving another target device indication and a next signal indicating the user's desire to receive the modified content from the target device while the content is being modified by the target device, the processor receives the modified content from the target device and displays it via the output unit.

15. The apparatus of claim 14, wherein the first signal comes from the data processing apparatus.

16. The apparatus of claim 14, wherein the first signal comes from the target device.

17. The apparatus of claim 14, wherein the next signal comes from the data processing apparatus.

18. The apparatus of claim 14, wherein the next signal comes from the target device.

19. The apparatus of claim 14, wherein the data processing apparatus is storing at least some of the content in a buffer while ceases transferring the content only to the output unit.

20. The apparatus of claim 19, wherein at least some of the said content stored in the buffer is included with the content being transferred to the target device.

21. The apparatus of claim 14, wherein the data processing apparatus is storing some of the content in a buffer while transferring content to the target device.

22. The apparatus of claim 21, wherein at least some of the said content stored in the buffer is included with the content being transferred to the target device.

23. The apparatus of claim 14, wherein the storage device is local and coupled to the processor via a local bus.

24. The apparatus of claim 14, wherein the storage device is remote and coupled to the processor via a network.

25. A data processing apparatus, comprising:
a processor, a storage device, an output unit, and a proximity sensor, which are collectively coupled for communicating content with a target device;
wherein the storage device is coupled to the processor, and for storing at least a content;
wherein the proximity sensor is capable to detect proximity to the target device and provides to the processor a target device indication indicating the proximity of the target device, and ceases providing the target device indication when the proximity of the target device is not detected;
wherein the processor accesses at least some of the content from the storage device, and transfers it to the output unit for display;
wherein, upon receiving the target device indication of the target device and receiving a signal indicating a user's desire to transfer at least some of the content to the target device, the processor ceases transferring the content only to the output unit and instead transfers at least some of the content to the target device, and content being transferred from the storage device to the target device is displayed by the target device.

26. The apparatus of claim 25, wherein the signal comes from the data processing apparatus.

27. The apparatus of claim 25, wherein the signal comes from the target device.

28. The apparatus of claim 25, wherein the data processing apparatus is storing at least some of the content in a buffer while ceases transferring the content only to the output unit.

29. The apparatus of claim 28, wherein at least some of the said content stored in the buffer is included with the content being transferred to the target device.

30. The apparatus of claim 25, wherein the data processing apparatus is storing some of the content in a buffer while transferring content to the target device.

31. The apparatus of claim 30, wherein at least some of the said content stored in the buffer is included with the content being transferred to the target device.

32. The apparatus of claim 25, wherein the storage device is local and coupled to the processor via a local bus.

33. The apparatus of claim 25, wherein the storage device is remote and coupled to the processor via a network.

* * * * *

UNITED STATES PATENT AND TRADEMARK OFFICE
CERTIFICATE OF CORRECTION

PATENT NO. : 9,854,033 B2
APPLICATION NO. : 15/162498
DATED : December 26, 2017
INVENTOR(S) : Frank C. Wang Page 1 of 1

It is certified that error appears in the above-identified patent and that said Letters Patent is hereby corrected as shown below:

In the Claims

Column 15 Lines 63-67 - Column 16 Lines 1-25 Claim 5 should read as follows:
"5. A data processing apparatus, comprising: a processor, a storage device, an output unit, and a proximity detection circuit, which are collectively coupled for communicating content with a target device; the storage device is coupled to the processor, and for storing at least: a content, at least some of the content is stored in a buffer before being communicated to the target device; and target device characteristics, including a characteristic of the target device is registered for communication with the processor; the proximity detection circuit to detect proximity to the target device and provide to the processor a target device indication indicating the proximity of the target device, and to cease providing the target device indication when the proximity of the target device is not detected; and the processor causing the content to be communicated from the storage device to the output unit and upon receiving the target device indication and a signal indicating a user's desire to transfer the content to the target device, the processor suspending the communication of the content only to the output unit and then transferring at least some of the content to the target device in accordance with the characteristic of the target device for displaying the content from the storage device on the target device."

Signed and Sealed this
Twenty-second Day of May, 2018

Andrei Iancu
*Director of the United States Patent and Trademark Office*